United States Patent
Miyazaki et al.

(10) Patent No.: US 7,612,604 B2
(45) Date of Patent: Nov. 3, 2009

(54) SEMICONDUCTOR INTEGRATED CIRCUIT DEVICE

(75) Inventors: Masayuki Miyazaki, Tokyo (JP); Yusuke Kanno, Hachioji (JP); Goichi Ono, Saitama (JP); Toshinobu Shinbo, Kitami (JP); Yoshihiko Yasu, Kodaira (JP); Kazumasa Yanagisawa, Kokubunji (JP); Takashi Kuraishi, Chofu (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/429,771

(22) Filed: May 6, 2003

(65) Prior Publication Data

US 2004/0016977 A1 Jan. 29, 2004

(30) Foreign Application Priority Data

May 7, 2002 (JP) .............................. 2002-131100

(51) Int. Cl.
*H03K 3/01* (2006.01)
(52) U.S. Cl. ...................................... 327/534; 327/544
(58) Field of Classification Search ................. 327/534, 327/535, 544; 365/227
See application file for complete search history.

(56) References Cited

U.S. PATENT DOCUMENTS 5,557,231 A  9/1996  Yamaguchi et al.
6,097,113 A * 8/2000 Teraoka et al. .............. 307/125
6,232,793 B1 * 5/2001 Arimoto et al. ............... 326/34
6,337,593 B1 * 1/2002 Mizuno et al. .............. 327/534
6,380,798 B1  4/2002 Mizuno et al.
6,414,534 B1 * 7/2002 Wang et al. ................. 327/333

FOREIGN PATENT DOCUMENTS

| JP | 59-111343 A | 6/1984 |
| JP | 6-89574 A | 3/1994 |
| JP | 11-135720 A | 5/1999 |
| JP | 2000-357962 A | 12/2000 |
| WO | WO 02/29893 A1 | 4/2002 |

OTHER PUBLICATIONS

Hiroyuki Mizuno et al., "A 18μA-Standby-Current 1.8V 200MHz Microprocessor with Self Substrate-Biased Data-Retention Mode," *1999 IEEE International Solid-State Circuits Confrence*, Feb. 1999, pp. 280-281.

* cited by examiner

*Primary Examiner*—Quan Tra
(74) *Attorney, Agent, or Firm*—Miles & Stockbridge P.C.

(57) ABSTRACT

A body bias control system allows for independent design of a functional module, thereby reducing the burden of designing the module. The body bias control system provides a switch circuit having an area in which the body bias is controlled independently of its outside portion, for controlling the supply of body bias in the vicinity of the area. Preferably three types of switches are provided for switching the body bias to suitable levels for a standby mode, a mode of normal operation and a mode of high-speed operation.

1 Claim, 15 Drawing Sheets

| MODE | BODY BIAS (vbp111/vbn111) |
|---|---|
| STAND BY | 2vdd/-vdd |
| NORMAL OPERATION | vdd/gnd |
| HIGH-SPEED OPERATION (FIXED FORWARD BIAS) | 0.5vdd/0.5vdd |
| ADAPTIVE OPERATION (OPTIMIZATION OF MONITOR CIRCUIT'S SPEED) | 0.5vdd~2vdd/ 0.5vdd~-vdd |

SEMICONDUCTOR INTEGRATED CIRCUIT DEVICE

BACKGROUND OF THE INVENTION

1. Field of the Invention

The present invention relates to a semiconductor integrated circuit device, and more particularly to a semiconductor integrated circuit device for achieving high speed and low power consumption at the same time.

2. Description of Related Art

High speed performance and the low power consumption are demanded of a semiconductor integrated circuit device using a CMOS circuit. Particularly, in the CMOS circuit to be used in a battery-driven device such as a portable information apparatus, since it becomes possible to extend the battery life by reducing the power consumption, manufacturers have demanded that the power consumption be reduced. The power consumption of the CMOS circuit includes dynamic power consumption associated with charging/discharging current during a switching operation and static power consumption due to subthreshold leakage current of the MOS transistor. Since the dynamic power consumption is in proportion to square of supply voltage vdd, the power consumption can be effectively reduced when the value of the supply voltage vdd is lowered. For this reason, the supply voltage vdd has gradually become lower. Also, in the semiconductor integrated circuit devices in recent years, there are also some devices provided with a power management system which stop the supply of a clock to the execution unit during standby. Due to the stop of supply of the clock, dynamic power consumption in an idle execution unit can be reduced. However, the static power consumption cannot be reduced by this method.

On the other hand, in order to prevent deterioration in working speed associated with a drop in the supply voltage vdd, it is necessary to lower the threshold voltage of a MOS transistor together with the lowering of the supply voltage vdd. Since subthreshold leakage current increases when the threshold voltage of the transistor is lowered, static power consumption, which has conventionally been negligible, becomes increasingly significant as the supply voltage vdd is reduced. The magnitude of the static power consumption then cannot be ignored as compared with the dynamic power consumption.

As a method for solving the above-described problem, there is known a method for controlling threshold voltage of the MOS transistor by setting a body bias to be variable as has been described in, for example, 1999 International Solid-State Circuits Conference Digest of Technical Papers, pp. 280-281 (February, 1999). In an active state for performing a normal operation in which a high-speed operation of the CMOS circuit is required, the body bias is set to supply voltage vdd for the pMOS transistor (p-channel type MOS transistor), and to ground voltage gnd for the nMOS transistor (n-channel type MOS transistor). On the other hand, in a standby state in which the CMOS circuit need not operate at high speed, the body bias is set to higher voltage than the supply voltage vdd for the pMOS transistor, and to voltage lower than the ground voltage gnd for the nMOS transistor. This operation will be referred to as "body bias will be deepened" or "body bias will be made into a reverse bias" hereinafter. In an operation mode in which the CMOS circuit does not operate or a low-speed operation is allowed, it is possible to raise the threshold voltage of the MOS transistor constituting the CMOS circuit by deepening the body bias, whereby it becomes possible to reduce the static power consumption.

SUMMARY OF THE INVENTION

In order to implement a CMOS semiconductor integrated circuit device capable of both higher speed performance and lower power consumption performance at the same time, it is effective to perform body bias control to the CMOS circuit as described above. During stoppage of the CMOS circuit like the standby state or in a mode in which a low-speed operation can be performed, the body bias is deepened, whereby the threshold voltage of the MOS transistor is raised to thereby reduce the subthreshold leakage current, thus making it possible to reduce the power consumption. In the active state in which the CMOS circuit is performing a normal operation, the threshold voltage is lowered to thereby speed up operation. As a method for lowering the threshold voltage, there is known, in addition to the previously-described method, a method for setting the body bias to lower voltage than the supply voltage vdd for the pMOS transistor, and to voltage higher than the ground voltage gnd for the nMOS transistor (this operation will be referred to as "body bias will be made shallow" or "body bias will be made into a forward bias" hereinafter), or a method for supplying an optimum body bias in response to variations and the like in the transistor manufacturing process, or the like.

Incidentally, in the semiconductor integrated circuit devices in recent years, a number of transistors to be integrated on one chip or the size of the circuit has become enormous, and the circuit modules to be arranged within the chip have also become complicated and diverse. As the structure of the interior of the chip becomes complicated as described above, body bias control also becomes complicated. As a result, an increase in the load of considering the body bias control when designing the circuit module leads to an increase in design time and an increase in design errors. Also, when an attempt is made to re-utilize an existing circuit module on designing a new semiconductor integrated circuit device, the existing module also may not be of module structure corresponding to the desired body control system. For this reason, even though the body bias control to details is going to be made in response to complicated processor chip and trend toward multifunction of the module within the chip, the disadvantages that the load of designing increases and that the existing circuit module cannot be used arise, which possibly results in making it difficult to achieve the desired performance and reduce electric power.

If a circuit block to be requested in order to control the body bias could be freely arranged outside a circuit module constituting the microprocessor, it would become possible to use the existing module without increasing the burden of designing the circuit module, thus making it possible to achieve optimum body bias control for each circuit module, and to implement higher performance of the chip and lower power consumption.

The present invention is characterized by various advantageous aspects, several examples of which are as follows:

(1) Even when the size and type of the circuit within the chip of the semiconductor integrated circuit to be constructed of the CMOS circuit such as the microprocessor are complicated and diverse, it is possible to design each circuit module without regard to the body bias control, and it becomes possible to shorten the design time and to improve the reliability.

(2) Even when utilizing the existing circuit module, it becomes possible to use it for design without regard to the body bias control, resulting in shortened design time and improved reliability.

(3) Even when combining circuit modules in diversified ways like ASIC, it is possible to design without regard to the body bias control, likewise enabling shortened design time and improved reliability.

(4) Arbitrary body bias control is rendered possible for each circuit module within the chip, whereby higher speed of the processor and the like and lower power consumption will be realized.

According to one aspect of the present invention, there is provided a semiconductor integrated circuit device, comprising: a bias generator for generating a first body bias voltage and a second body bias voltage; a circuit module including at least a MOS transistor; a body bias switch circuit including a first MOS transistor to control supply of a first body bias voltage and a second MOS transistor to control supply of a second body bias voltage, respectively; a switch controller to control the body bias switch circuit, wherein in a second area in contact with at least one side of a first area in which a circuit module is arranged, the body bias switch circuit is arranged, when the circuit module is in a first state, the switch controller to turn ON the first MOS transistor of the body bias switch circuit to supply the first body bias voltage to a well of the MOS transistor of the circuit module, and when the circuit module is in a second state, the switch controller to turn ON the second MOS transistor of the body bias switch circuits to supply the second body bias to the well of the MOS transistor of the circuit module, so that the body bias voltage of the MOS transistor of the circuit module arranged in the first area is controlled independently of and from the outside of the first area.

Also, according to another aspect of the present invention, there is provided a semiconductor integrated circuit device, comprising: a bias generator to generate a first body bias voltage, a second body bias voltage and a third body bias voltage; a circuit module including at least a MOS transistor; a body bias switch circuit including a first MOS transistor to control supply of the first body bias voltage, a second MOS transistor to control supply of the second body bias voltage and a third MOS transistor to control supply of the third body bias voltage, respectively; and a switch controller to control the body bias switch circuit, wherein when the circuit module is in the first state, the switch controller to turn ON the first MOS transistor of the body bias switch circuit to supply the first body bias voltage to a well of the MOS transistor of the circuit module; when the circuit module is in the second state, the switch controller to turn ON the second MOS transistor of the body bias switch circuit to supply the second body bias to well of the MOS transistor of the circuit module; and when the circuit module is in the third state, the switch controller to turn ON the third MOS transistor of the body bias switch circuit to supply the third body bias to well of the MOS transistor of the circuit module.

DETAILED DESCRIPTION OF THE PREFERRED EMBODIMENTS

Hereinafter, with reference to the drawings, the description will be made of the present invention.

Figure 1:
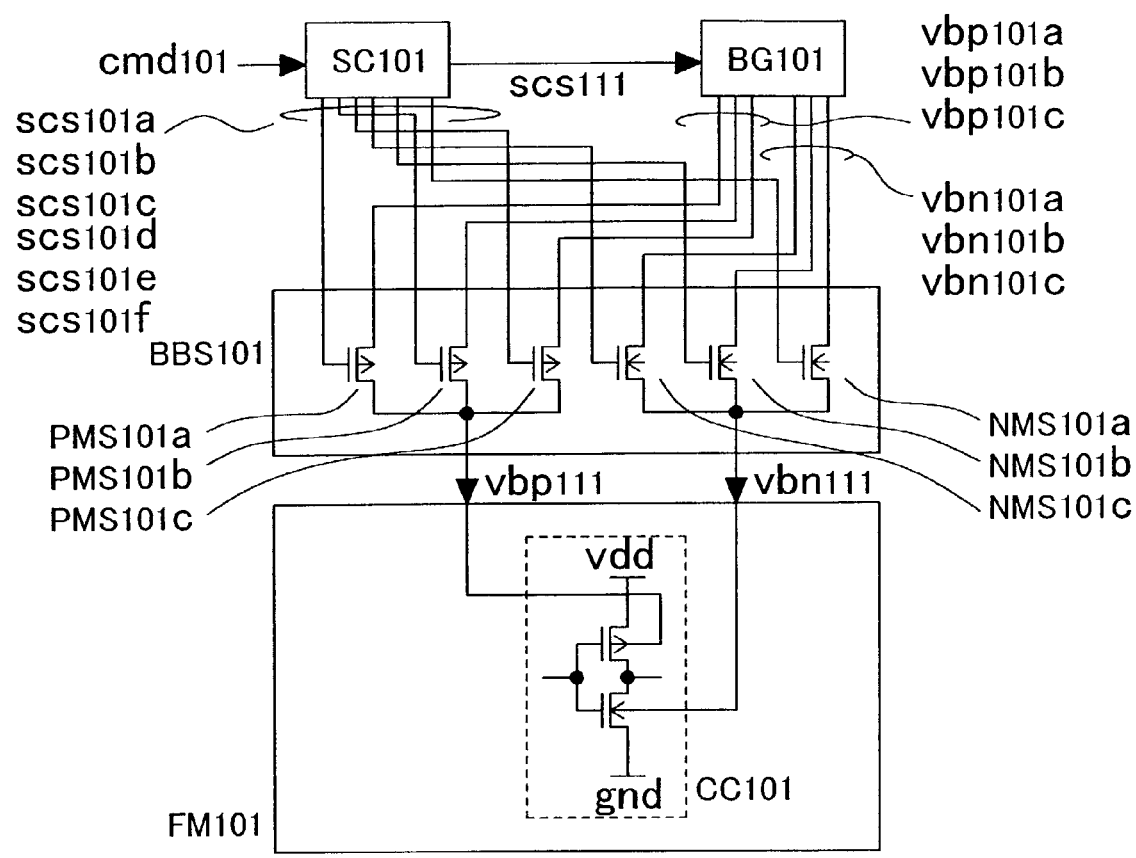
FIG. 1 is a view showing a first structural example of the present invention.

FIG. 1 is a view showing the first structural example of the present invention.

A semiconductor integrated circuit device according to the present embodiment is composed of: a functional module FM101 constituting a semiconductor integrated circuit such as a microprocessor consisting of a CMOS circuit; a switch controller SC101; a bias generator BG101; and a body bias switch circuit BBS101. The functional module FM101 consists of the CMOS circuit CC101. The body bias switch circuit BBS101 is constructed of pMOS transistors PMS101a-101c and nMOS transistors NMS101a-101c. The switch controller SC101 receives an instruction signal cmd101 to output a bias control signal scs111 to the bias generator BG101 and switch control signals scs101a to 101f to the bias switch circuit BBS101. The bias generator BG101 outputs, in response to the bias control signal scs111, body biases vbp101a to 101c for the pMOS transistors and body biases vbn101a to 101c for the nMOS transistors. The body bias switch circuit BBS101 outputs, in response to a switch control signal scs101a to 101f, a predetermined body bias generated by the bias generator BG101 to the functional module FM101. The functional module FM101 inputs a body bias vbp111 for the PMOS transistor and a body bias vbn111 for the nMOS transistor to supply the respective body biases vbp111 and vbn111 to the PMOS transistor body and nMOS transistor body of the CMOS circuit CC101 provided therein.

Figure 19:
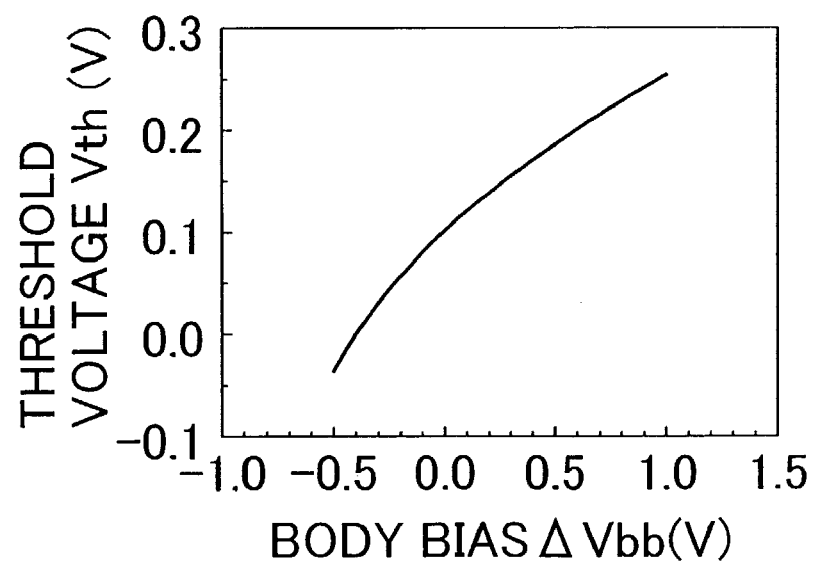
FIG. 19 is a view showing the dependence of MOS transistor threshold voltage on the body bias.
Figure 20:
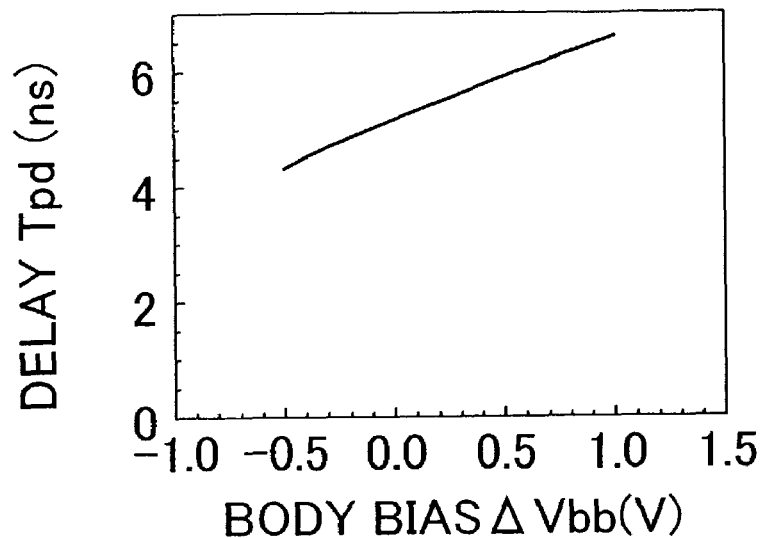
FIG. 20 is a view showing the dependence of CMOS circuit delay on the body bias.
Figure 21:
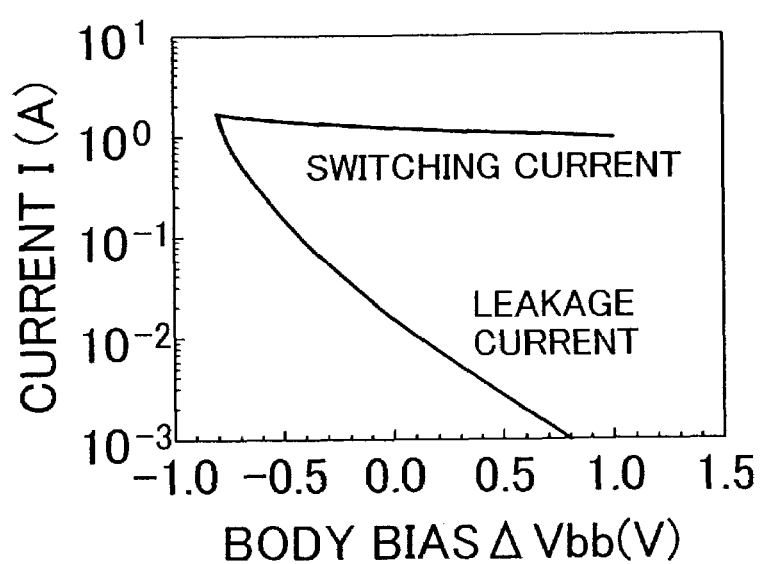
FIG. 21 is a view showing the dependence of CMOS circuit leakage current and switching current on the body bias.

The threshold voltages of the MOS transistors constituting the CMOS circuit can be changed by adjusting the body bias. FIG. 19 shows relationship between the body bias and the threshold voltage in the MOS transistor. A state when the body is connected to the supply voltage vdd for the pMOS transistor or is connected to the ground voltage gnd for the nMOS transistor corresponds to the body bias 0 in FIG. 19. When the body bias has a positive value, it corresponds to a case where the body bias is deepened to turn to a reverse bias, and when the body bias has a negative value, it corresponds to a case where the body bias is made shallow to turn to a forward bias. As shown in the drawing, when the body bias is made deep to the reverse bias, the threshold voltage of the MOS transistor becomes higher, while when the body bias is made shallow to the forward bias, the threshold voltage of the MOS transistor becomes lower. The influences that the body bias and the threshold voltage exert on the speed and electric power of the CMOS circuit are shown in FIGS. 20 and 21. FIG. 20 shows the dependence of delay of the CMOS circuit on the body bias. When the body bias is set to a reverse bias, the CMOS circuit operates at low speed because the threshold voltage of the MOS transistor becomes higher, and the delay becomes large. When the body bias is set to a forward bias, the CMOS circuit operates at high speed because the threshold voltage of the MOS transistor becomes lower, and the delay becomes small. FIG. 21 shows the dependence of subthreshold leakage current and switching current of the CMOS circuit on the body bias. When the body bias is set to a reverse bias, the leakage current decreases because the threshold voltage of the MOS transistor becomes higher. When the body bias is set to a forward bias, the leakage current increases because the threshold voltage of the MOS transistor becomes lower. By varying the body bias, switching current also varies in accordance with an amount by which working speed of the CMOS circuit varies, but it can be said that it hardly varies as compared with the variation in leakage current. As can be seen from FIG. 21, when the value of the forward bias becomes too large, the leakage current also increases such that it cannot be ignored as compared with the switching current.

Figures 11, 12:
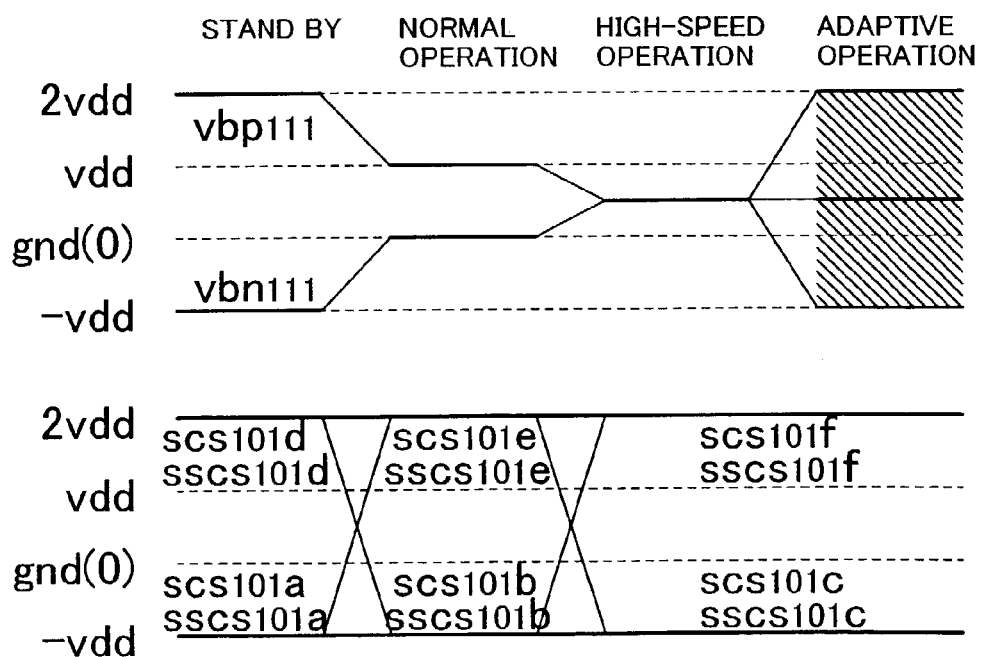
FIG. 11 is a view showing an example of the operating mode and body bias.
FIG. 12 is a view showing operating waveforms according to the present invention.

The functional module FM101 to be constructed of the CMOS circuit and the CMOS circuit CC101 constituting it are capable of changing the mode of operation by controlling the body biases vbp111 and vbn111. A first mode reduces the leakage current through the CMOS circuit through the use of the reverse bias. Since the threshold value of the MOS transistor rises at this time, the working speed of the CMOS circuit becomes slower. Therefore, this is used in the standby mode in which a low-speed operation is allowed or no operation is made. A second mode is a mode with 0 in body bias, in which supply voltage vdd is supplied as the body bias vbp111 of the pMOS transistor and ground voltage gnd is supplied as the body bias vbn111 of the nMOS transistor. The threshold voltage becomes the same as the initial design value of the MOS transistor. The performance of the CMOS circuit is medium consumption power at medium speed. Standard design of the functional module FM101 becomes a mode of operation with a highest degree of reliability because the design is performed in a mode of this body bias being 0. A third mode is to lower the threshold of the MOS transistor through the use of the forward bias. Therefore, the working speed of the CMOS circuit becomes faster, but the leakage current increases to affect the power consumption. The mode of operation at high speed and at high power consumption enters. In this third mode, it may be also possible to perform optimum control of the body bias through the use of a speed monitor circuit. When the optimum control is performed, it becomes possible to always produce fixed performance irrespective of variations in manufacture, voltage fluctuation and a change in temperature, and a mode of operation at high speed and at low power can be realized by restraining the variations. FIG. 11 shows an example of types of mode and body bias value at the time. The standby mode corresponds to the above-described first mode, the mode of normal operation corresponds to the second mode, and the high-speed operation or the optimum operation, the third mode. FIG. 12 shows operating transition waveform at voltage levels of body biases vb111 and vbn111 in each mode and operating waveform of each switch control signal corresponding thereto.

In the foregoing description, it has been assumed that the supply voltage vdd is 1.0V and the ground voltage gnd is voltage of about 0.0V, but these voltages are variable. This also holds in the following description. However, since the subthreshold leakage current increases due to the lowered threshold, the effect obtained by applying the present invention is great when the supply voltage vdd is 1.0 V or less.

In order to implement such functions as described above on one chip, in the present embodiment, a body bias switch circuit BBS101 is arranged for each of a plurality of functional modules FM101. In contrast to this, it will be arranged such that the switch controller SC101 and the bias generator BG101 can control a plurality of functional modules and that at least one can be arranged on one chip. With such structure, the functional modules allow for performing design, layout and the like without consideration of anything concerning the body bias control. After the functional module FM101 is designed, the body bias switch circuit BBS101 has only to be arranged close thereto. Therefore, it becomes possible to reduce errors in design and to shorten the design period.

The body bias switch circuit BBS101 is constructed of a switch circuit consisting of three pMOS transistors and a switch circuit consisting of three nMOS transistors. A drain of the pMOS transistor is common-connected and is supplies to the functional module FM101 the body bias vbp111. The drain of the nMOS transistor is common-connected and supplies to the functional module FM101 the body bias vbn111. To a source of the pMOS transistor switch PMS101a, voltage corresponding to a reverse bias 2 vdd is conveyed from a bias generator through vbp101a. To the source of PMS101b, voltage corresponding to a normal bias vdd is conveyed from the bias generator through vbp101b. To the source of PMS101c, voltage corresponding to a forward bias 0.5 vdd or an optimum body bias between 2 vdd and 0.5 vdd is conveyed from the bias generator through vbp101c. To the source of the nMOS transistor switch NMS101a, voltage corresponding to a reverse bias −vdd is conveyed from the bias generator through vbn101a. To the source of NMS101b, voltage corresponding to the normal bias gnd is conveyed from the bias generator through vbn101b. To the source of NMS101c, voltage corresponding to a forward bias 0.5 vdd or an optimum body bias between −vdd and 0.5 vdd is conveyed from the bias generator through vbn101c.

The gates of the MOS transistors constituting the body bias switch circuit BBS101 are ON-OFF controlled by switch control signals scs101a to 101f. When, for example, an instruction signal cmd101 orders standby mode that is the first mode, switch control signals scs101a and scs101d are asserted, the MOS transistors PMS101a and NMS101a turn ON and body biases vbp101a and vbn101a are supplied to the functional module FM101. Similarly, when the instruction signal cmd101 orders mode of normal operation that is the second mode, switch control signals scs101b and scs101e are asserted, the MOS transistors PMS101b and NMS101b turn ON and body biases vbp101b and vbn101b are supplied to the functional module FM101. Similarly, when the instruction signal cmd101 orders mode of high-speed operation that is the third mode, switch control signals scs101c and scs101f are asserted, the MOS transistors PMS101c and NMS101c turn ON and body biases vbp101c and vbn101c are supplied to the functional module FM101.

These switch control signals preferably operate at maximum amplitude in order to reduce on resistance of the MOS transistors constituting the body bias switch circuit BBS101. In other words, the amplitude of each switch control signal can be used between 2 vdd and −vdd as shown in FIG. 12. As regards body biases vbp111 and vbn111 to be supplied to the functional module FM101, there are two types of combinations depending upon the instruction signal cmd 101: a combination of low-speed low-leakage current mode (standby mode), intermediate-speed intermediate-leakage current mode (mode of normal operation) and high-speed high-leakage current mode (mode of high-speed operation) and a combination of low-speed low-leakage current mode (standby mode), intermediate-speed intermediate-leakage current mode (mode of normal operation) and high-speed low-leakage current mode (mode of adaptive operation).

Figure 2:
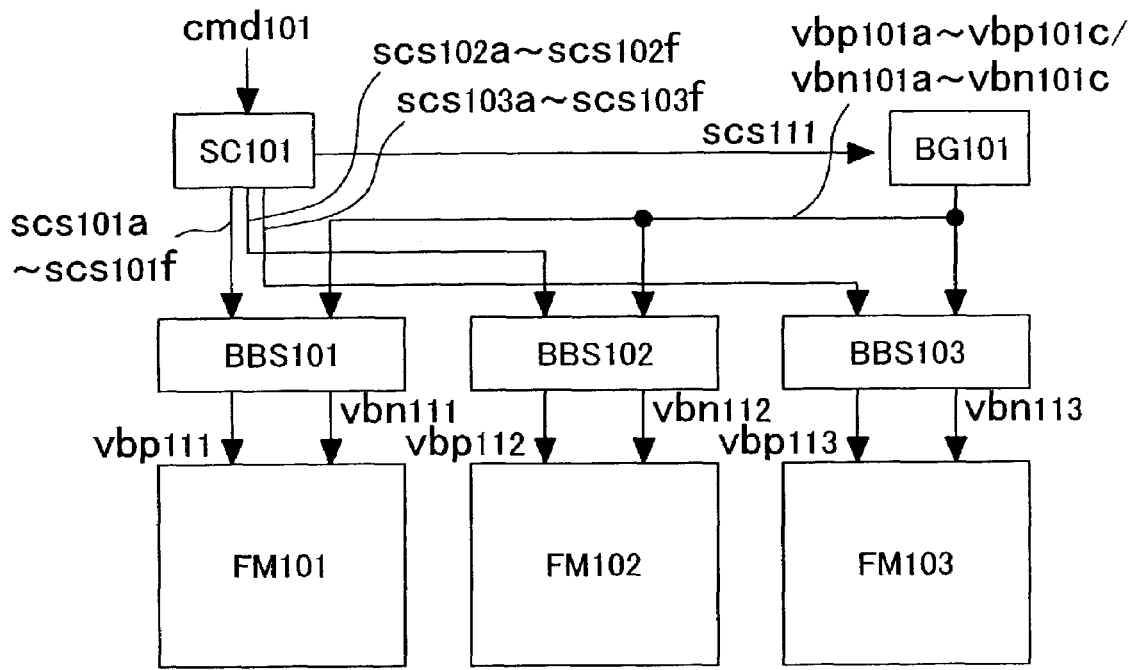
FIG. 2 is a view showing a structural example when a plurality of functional modules are mode-controlled independently.

FIG. 2 is a view showing a structural example when a plurality of functional modules are independently mode-controlled. Structure having the same function as the structure illustrated in FIG. 1 is indicated by the same symbols as in FIG. 1 (also with the subsequent drawings). Correspondingly to the functional modules FM101 to FM103 having a plurality of different functions, the body bias switch circuits BBS101 to BBS103 are respectively arranged. Six types of voltage signals to be generated by the bias generator BG101 are composed of reverse bias signals vbp101a (=2 vdd) and vbn101a (=−vdd) for the standby mode, 0-bias signals vbp101b (=vdd) and vbn101b (=0) for the normal operation, and forward bias signals vbp101c (=0.5 vdd) and vbn101c (=0.5 vdd) for the mode of high-speed operation. These six types of voltage signals are all uniformly supplied to the body bias switch circuits BBS101, BBS102 and BBS103. In order to set respective functional modules to an arbitrary body bias mode in response to the instruction signal cmd101, the switch controller SC101 generates switch control signals scs101a to f, scs102a to f and scs103a to f. When three functional modules are arranged on one chip as shown in the drawing, since each is supplied with a body bias correspondingly to three types of modes of operation, nine types of instruction signals cmd101 will be issued correspondingly to combinations of modes of operation that each functional module can take. With such structure, each functional module FM101, FM102 and FM103 becomes capable of obtaining body bias signals vbp111 and vbn111, vbp112 and vbn112, and vbp113 and vbn113 for entering a respectively independent mode in accordance with the instruction signal cmd101.

As described above, each functional module FM and each body bias switch circuit BBS are caused to have an one-to-one correspondence therebetween, the switch control signal SCS transmits instruction signals that are different for each body bias switch circuit BBS, and the body bias signals vbp, vbn to be generated by the bias generator BG are commonly supplied to the body bias switch circuit BBS. This facilitates body bias design irrespective to increase or decrease in the functional module BBS.

Figure 3:
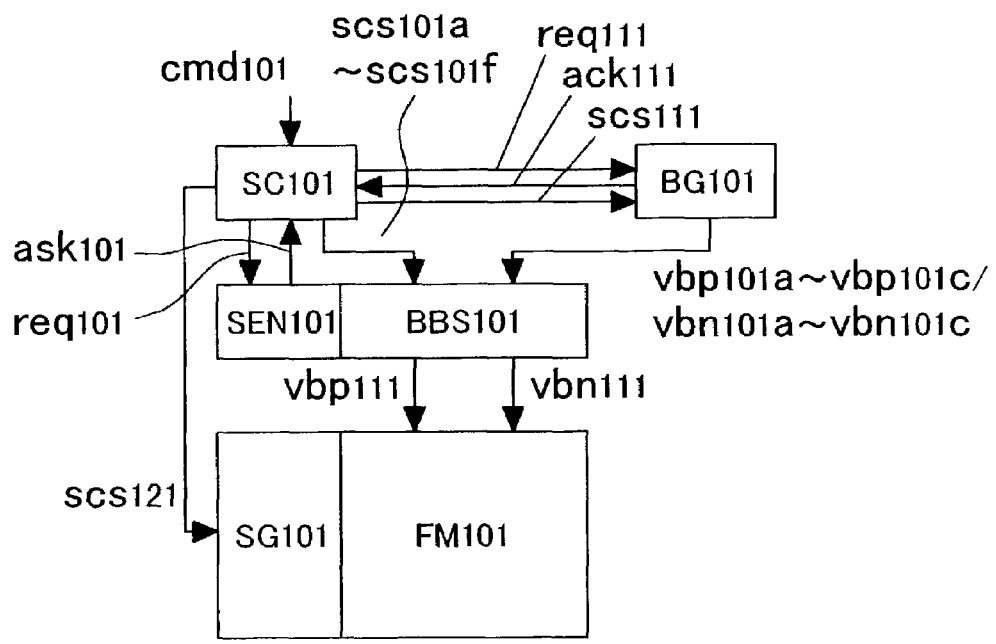
FIG. 3 is an explanatory view for illustrating a method for body bias control of the functional module in detail.

FIG. 3 is a view for explaining a method for controlling a body bias of the functional module in detail. The functional module FM101 has a gate circuit SG101. Also, the body bias switch circuit BBS101 has a sensor circuit SEN101. The switch controller SC101 transmits a request signal req111 to the bias generator BG101 to receive an acknowledge signal ack111. Also, the switch controller SC101 transmits a request signal req101 to the sensor circuit SEN101 to receive an acknowledge signal ack101. Also, the switch controller SC101 outputs a module control signal scs121 to the gate circuit SG101.

The bias generator BG101 generates a bias signal vbp, vbn responsive to the bias control signal scs111 when the request signal req111 is asserted. When, of bias signals vbp101a to 101c, and vbn101a to 101c, the level of a requested signal reaches a predetermined value, the bias generator BG101 asserts the acknowledge signal ack111 to return it to the switch controller SC101. When the request signal req101 is asserted, the sensor circuit SEN101 activates the body bias switch circuit BBS101 through the use of a switch control signal to cause the body bias output vbp111 and vbn111 to transition. The sensor circuit SEN101 detects that the voltage level of the body bias output vbp111 and vbn111 has reached a predetermined value, and asserts the acknowledge signal ack101 to return to the switch controller SC101. When two acknowledge signals ack101 and ack111 are both asserted, the switch controller SC101 asserts the module control signal scs121 to convey to the gate circuit SG101. The gate circuit SG101 controls the operation or stoppage of the functional module FM101 in accordance with the module control signal scs121.

For example, when causing the functional module FM101 to transition from the standby state to a normal operating state, the bias generator BG101 generates body bias signals vbp101b and vbn101b that are required for a normal operation in response to request signals req101 and req111 from the switch controller SC101, and will assert, if the voltage level has become vdd and gnd respectively, the acknowledge signal ack111. The sensor circuit SEN101 will switch the output from the body bias switch circuit BBS101 in response to the request signal req101 to connect the body bias output vbp111 and vbn111 to the body bias signals vbp101b and vbn101b respectively. The sensor circuit SEN101 detects the body bias output vbp111 and vbn111 for voltage level, and if they are vdd and gnd respectively, will assert the acknowledge signal ack101. Thereafter, when the acknowledge signals ack101 and ack111 are asserted, the switch controller SC101 generates the module control signal scs121. On receipt of the module control signal scs121, the gate circuit SG101 starts inputting the signal to the functional module FM101. In accordance with the above-described procedure, confirming that the body bias of each of the functional modules is at a voltage level responsive to the instruction signal cmd101, the gate circuit SG101 starts or stops the operation of the functional module. Thus, the stable operation of each functional module is realized and the reliability of the semiconductor integrated circuit device is enhanced.

Figure 7:
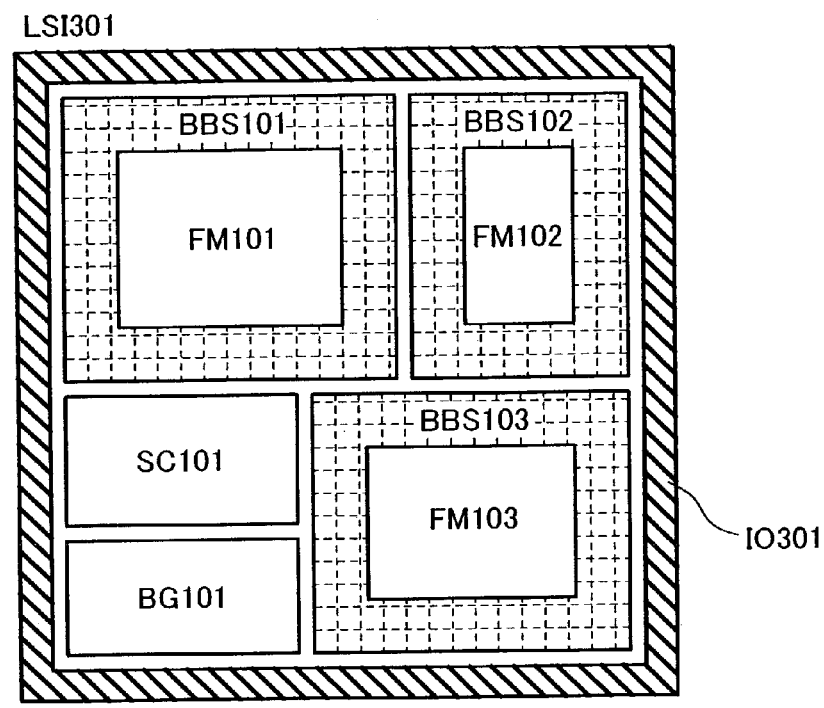
FIG. 7 is a view showing a layout of the first structural example according to the present invention.

FIG. 7 shows a layout for a semiconductor integrated circuit device according to the present invention. One CMOS LSI chip is configured into a layout consisting of areas of the functional modules FM101 to 103 to be constructed of one I/O circuit module 10301, one switch controller SC101, one bias generator BG101, a plurality of body bias switch circuits BBS101 to 103, and a plurality of CMOS circuits. In order to stabilize the operation of the CMOS circuit to be included in the functional modules FM101 to 103, it is required that each of the body bias switch circuits BBS101 to 103 have a measure of current-supplying capability to stabilize the body bias. For this reason, one of the body bias switch circuits BES101 to 103 must be provided for each of the functional modules FM101 to 103. The plurality of body bias switch circuits BBS101 to 103 are laid out so as to surround the outer periphery of the functional module to which each of them corresponds. In this respect, FIG. 7 shows an example in which each of the body bias switch circuits BBS101 to 103 surrounds the outer periphery of its corresponding one of the functional modules FM101 to 103. However, it is not necessary to arrange each body bias switch circuit to surround all sides of the functional module with which it corresponds. It is the feature that no body bias switch circuit is arranged within the corresponding functional module, and the body bias switch circuit can be arranged at the outer periphery of the module to such a degree that necessary current-supplying capability can be obtained. Also, in the present embodiment, each of the body bias switch circuits BBS101 to BBS103 may cope with a method of applying three types of body biases, but the present invention is not limited thereto. It is also possible to constitute the body bias switch circuit BBS so as to cope with a method of applying two types or less body biases. For example, it is possible to constitute each of the body bias switch circuits BBS101 to BBS103 so as to cope with a combination of the reverse bias and the body bias 0, a combination of the forward bias (or adaptive bias) and the body bias 0, and a combination of the reverse bias and the forward bias (or adaptive bias).

In the functional module in which the body bias control is performed, for example, FM101, it is possible to freely design without consideration of the position of the body bias supplying switch and the shape of the module in the layout during designing. Since it can be arranged so as to surround the outer periphery of the functional module FM101 produced, the body bias switch circuit BBS101 is to insure the simplification of design and a high degree of reliability without causing any burden on the design of each functional module. Further, in the layout area of the body bias switch circuit laid out at the outer periphery of the functional module FM101, power wiring vdd and gnd and body bias wiring vb111 and vbn111 can be carried out around. Thereby, strong design against resistance to noise, resistance to voltage drop and the like can be implemented to enhance the reliability on the circuit in the layout design.

Figure 13:
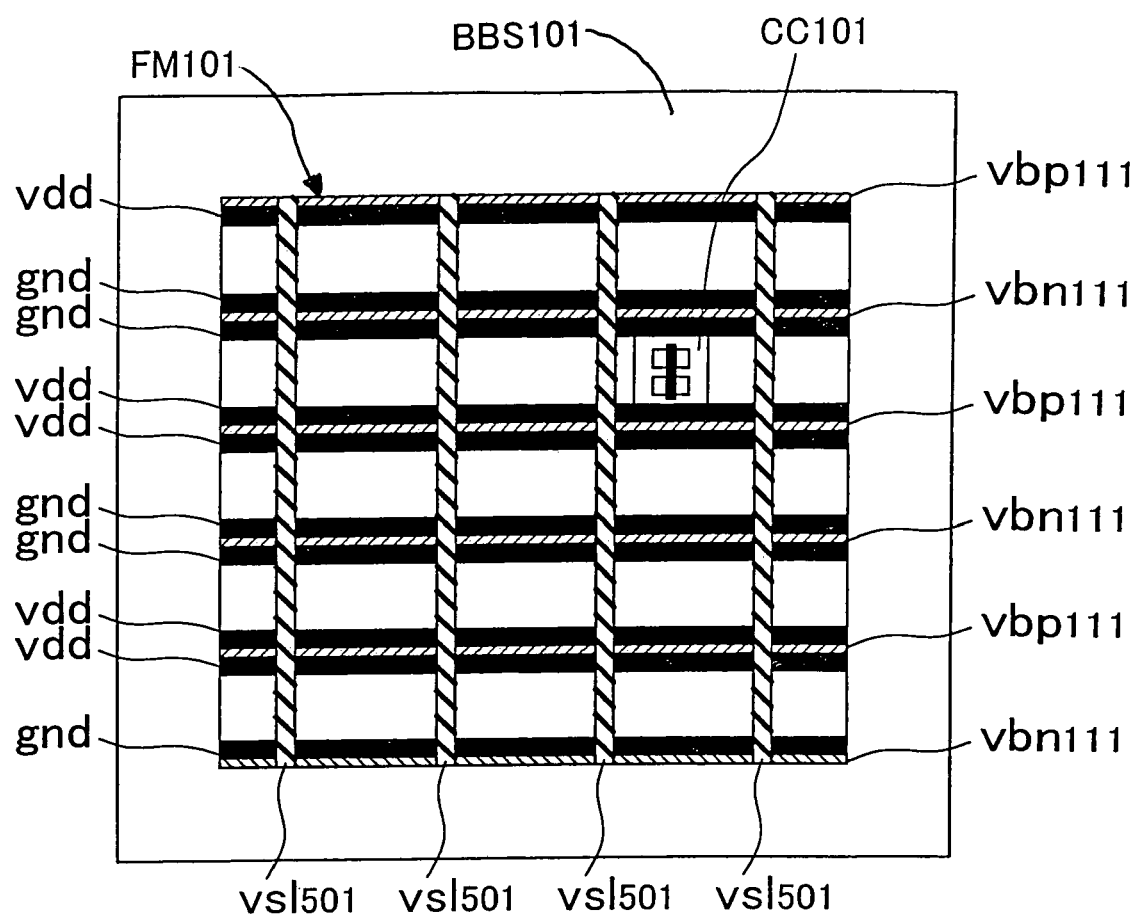
FIG. 13 is a view showing an example of a layout according to the present invention.

FIG. 13 shows the embodiment for a layout including the body bias switch circuit BBS101 and the functional module FM101. Within the functional module FM101, the CMOS circuit CC101 is arranged as shown in the drawing, and with the CMOS circuit CC101 sandwiched in parallel, there are wired a power line vdd, a ground line gnd, and body bias lines vb111 and vbn111. In a direction perpendicular to these lines, there is wired a main power source line including all the power supply vdd, the ground gnd, and the body biases vb111 and vbn111. In accordance with such structure, wiring relating to power supply is arranged in mesh shape within the functional module, and enables to supply stable voltage by combining with the surrounded wiring in the body bias switch circuit area.

Figure 8:
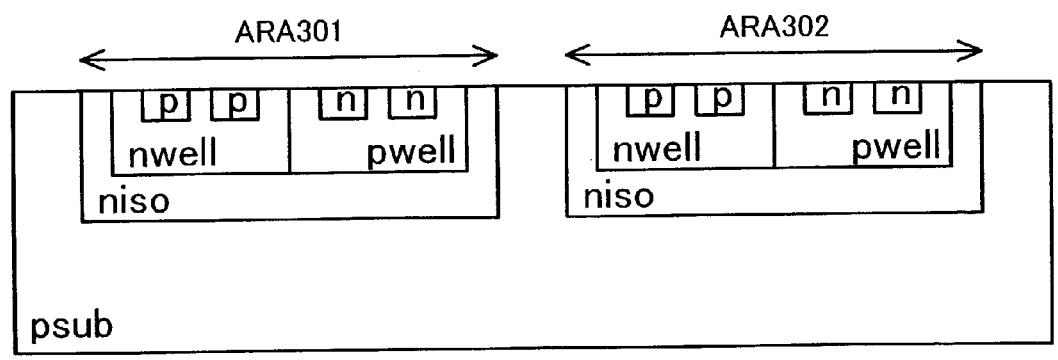
FIG. 8 is a view showing device structure of a semiconductor integrated circuit device to which the present invention is applied.

FIG. 8 shows the cross-sectional structure of a chip to which the body bias control is applied. This is an example of a triple well structure. The pMOS transistor is constructed of a p-type diffusion layer p and an n-type well nwell, and the nMOS transistor is constructed of an n-type diffusion layer n and a p-type well pwell. The transistor body is divided into nwell and pwell portions respectively. A body bias vbp111 for the pMOS transistor is supplied to nwell in the drawing and a body bias vbn111 for the nMOS transistor is supplied to pwell in the drawing. Since it becomes necessary to apply different body biases in two layout areas (ARA301 and ARA302), there is provided an n-isolator niso in the lower layer of the well layer. Such structure is adopted, whereby the body bias control for each layout area can be performed for the body psub of the p-type wafer. In this case, the functional module FM101 is configured in the layout area ARA301, and this periphery is surrounded as the body bias switch circuit BBS101 through the use of the layout area ARA302, whereby it becomes easier to cause the body bias of the functional module FM101 to become independent of other modules for being controlled.

Figure 9:
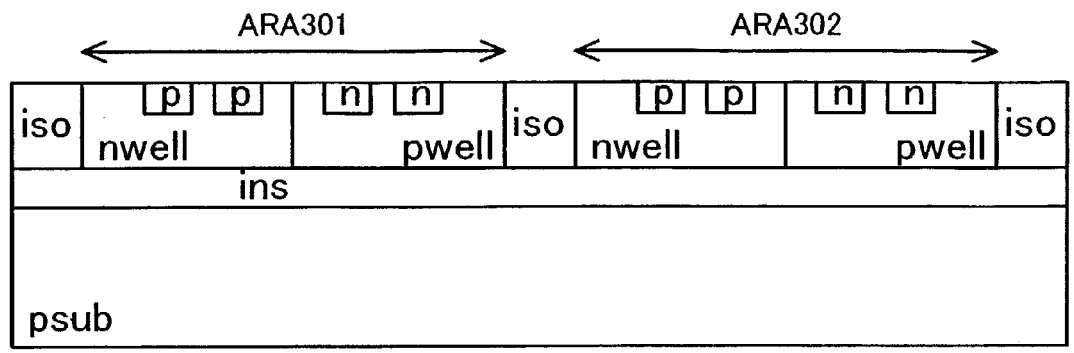
FIG. 9 is a view showing another device structure of the semiconductor integrated circuit device to which the present invention is applied.

FIG. 9 shows another cross-sectional structure of a chip to which the body bias control is applied. This drawing shows an embodiment of a SOI (Silicon on Insulator) structure. An insulator ins made of film oxide is formed on the surface of the P type wafer body psub, and on top of the insulator ins, the MOS transistor is formed. Between the layout areas ARA301 and ARA302, it is possible to separate the body with an insulated isolator iso. Even with this structure, it is possible to facilitate the body bias control for each functional module similarly.

Figure 4:
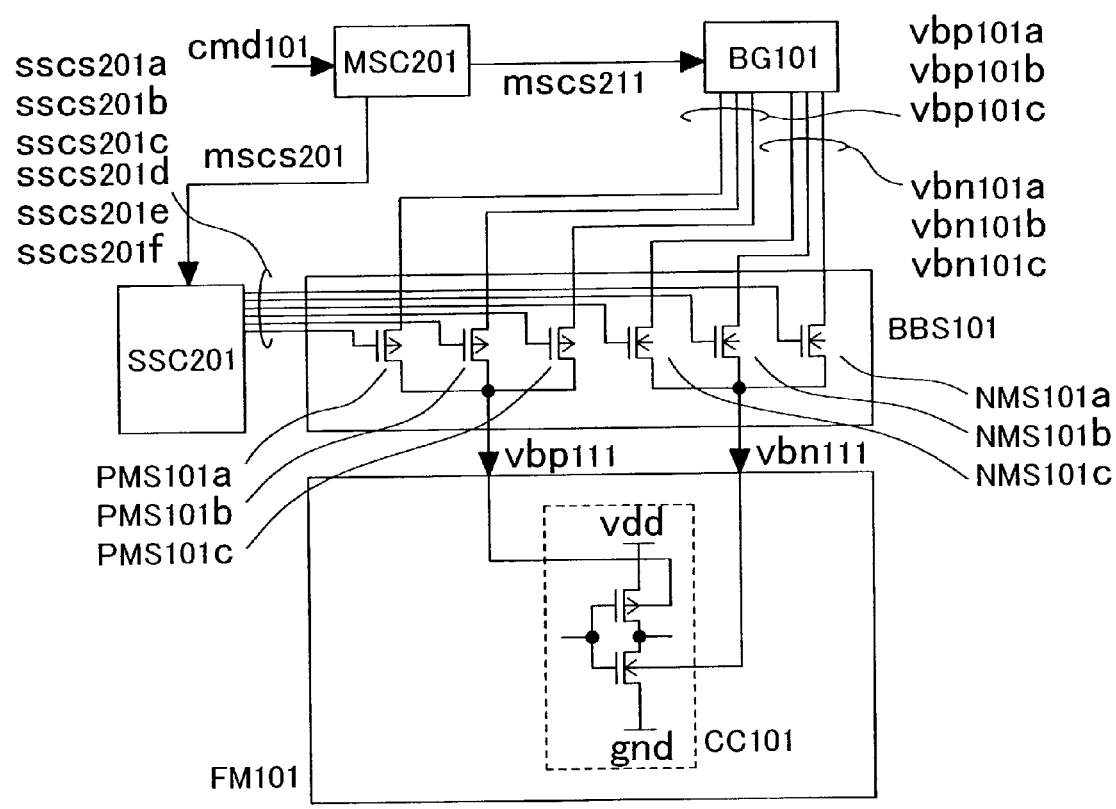
FIG. 4 is a view showing a second structural example of the present invention.

FIG. 4 is a view showing a second structural example according to the present invention.

The structural example of FIG. 4 has a master switch controller MSC201 and a slave switch controller SSC201. The master switch controller MSC201 receives an instruction signal cmd101 to output a bias control signal mscs211 to the bias generator BG101, and a master switch control signal mscs201 to the slave switch controller SSC201. The slave switch controller SSC201 outputs slave switch control signals sscs201a to 201f in response to the master switch control signal mscs201. The bias generator BG101 outputs, in response to the bias control signal mscs211, body biases vbp101a to 101c for the pMOS transistor, and body biases vbn101a to 101c for the nMOS transistor. In this structural example, the body bias switch circuit BBS101 for supplying the desired body biases vbp111 and vbn111 to the plurality of functional modules FM101 and the slave switch controller SSC201 for controlling the body bias switch circuit BBS101 will be arranged for each of the respective functional modules. At least one each of the master switch controller MSC101 and the bias generator BG101 can be arranged on one chip.

As shown in FIG. 1, the switch controller SC101 controls ON and OFF of the body bias switch circuit BBS101. However, since voltage to be applied to the well of a transistor constituting the CMOS circuit differs with the mode, voltage required for controlling ON and OFF with switch control signals scs101a to 101c and scs101d, to 101f differs. In the structural example of FIG. 4, the switch controller is divided into a master switch controller MSC201 and a slave switch controller SSC201, and the master switch controller MSC201 is constructed of a digital logic circuit for controlling ON and OFF, while the slave switch controller SSC201 is constructed of a level shifter. This is particularly effective structure when different voltage levels are to be used by the functional module. Since the MOS transistor to be used for the functional module is used at voltage between the normal supply voltage vdd and the ground voltage gnd, there is used a transistor having a gate insulator with rather thin film thickness. (hereinafter, such a MOS transistor will be referred to as "thin film transistor".) In contrast to this, in a circuit for supplying the body bias, it is necessary to operate within a voltage range corresponding to 3 vdd, from 2 vdd at maximum to −vdd. For this reason, the breakdown voltage level of the thin film transistor is exceeded so that disruption of the gate insulator or disruption of junction within the transistor will occur. Therefore, for the MOS transistor to be used in such a circuit, a transistor using a gate insulator having a larger film thickness than the thin film transistor will be used (hereinafter, such a MOS transistor will be referred to as "thick film transistor"). The master switch controller MSC201 and the functional module FM101 can be constructed of thin film transistors, and the slave switch controller SSC201, the bias generator BG101 and the body bias switch circuit BBS101 can be constructed of thick film transistors. This clear distinction will expedite the facilitation of designing. The thick film transistor can be also used for I/O buffers.

Figure 5:
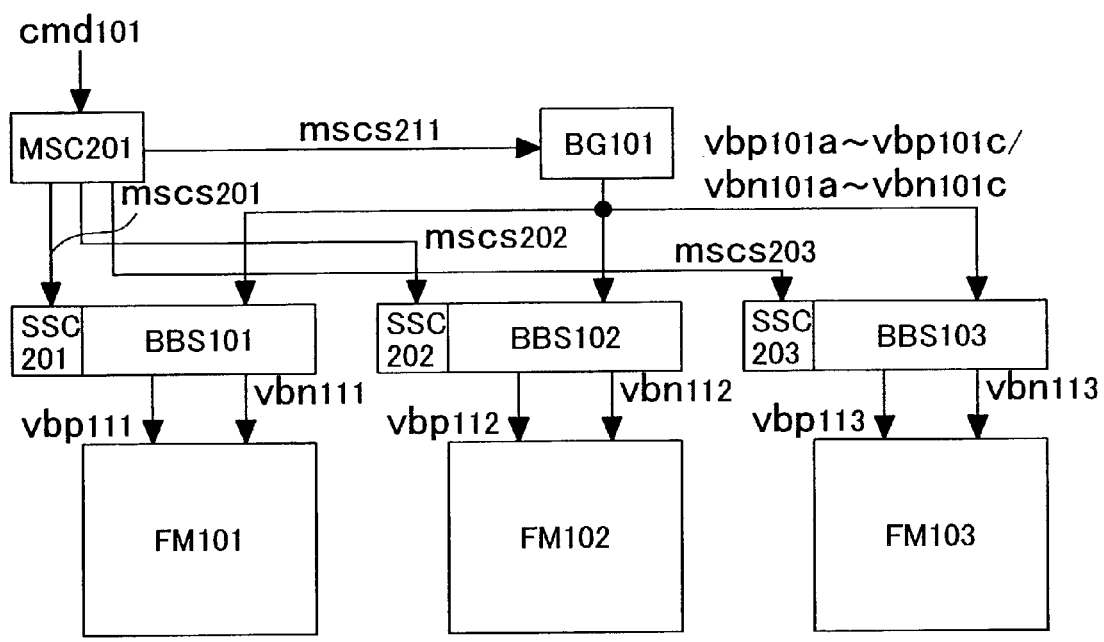
FIG. 5 is a view showing a structural example when a plurality of functional modules are mode-controlled independently.

FIG. 5 is a view showing a structural example in which a plurality of functional modules are independently mode-controlled. As shown, slave switch controllers SSC and body bias switch circuits BBS are provided correspondingly to functional modules FM. A master switch controller MSC201 receives an instruction signal cmd101 to output a master switch control signal mscs201 for a slave switch controller SSC202, a master switch control signal mscs202 for a slave switch controller SSC202 and a master switch control signal mscs203 for a slave switch controller SSC203. The slave switch controller SSC outputs a slave switch control signal in response to the respective master switch control signal mscs to control the body bias switch circuit BBS which corresponds. On the other hand, the bias generator BG101 receives a bias control signal mscs211 to supply, to the body bias switch circuits BBS101 to 103, all of body biases vbp101$a$ to 101$c$ for the pMOS transistor, and body biases vbn101$a$ to 101$c$ for the nMOS transistor. Six types of voltage signals which the bias generator BG101 generates are, for example, reverse bias signals vbp101$a$ (=2 vdd) and vbn101$a$ (=vdd) for the standby mode, 0 bias signals vbp101$b$ (=vdd) and vbn101$b$ (=0) for the normal operation, and forward bias signals vbp101$c$ (=0.5 vdd) and vbn101$c$ (=0.5 vdd) for the high-speed operation mode.

Figure 6:
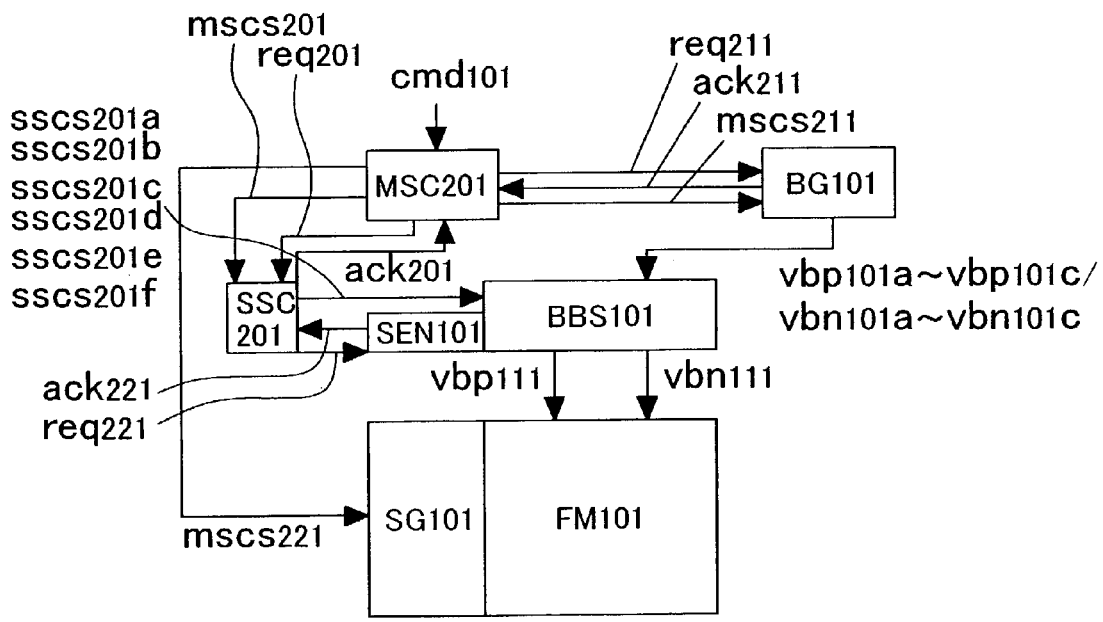
FIG. 6 is an explanatory view for illustrating the method for body bias control of the functional module in detail.

FIG. 6 is an explanatory view for illustrating a method for controlling the body bias of the functional module in detail. The master switch controller MSC201 transmits a request signal req211 to the bias generator BG101 to receive an acknowledge signal ack211. Also, the master switch controller MSC201 transmits a request signal req201 to the slave switch controller SSC201 to receive an acknowledge signal ack201. Also, the slave switch controller SSC201 transmits a request signal req221 to a sensor circuit SEN101 which the body bias switch circuit BBS101 has to receive an acknowledge signal ack221. Also, the master switch controller MSC201 outputs a module control signal mscs221 to a gate circuit SG101 which the functional module FM101 has.

The bias generator BG101 generates a bias signal responsive to the bias control signal mscs211 when the request signal req211 is asserted. When, of bias signals vbp101$a$ to 110$c$, and vbn101$a$ to 101$c$, the level of a requested signal reaches a predetermined value, the bias generator BG101 asserts the acknowledge signal ack211 to return it to the master switch controller MSC201. The slave switch controller generates a request signal req221 when the master switch controller transmits a request signal req201, and returns the acknowledge signal ack221 to the master switch controller MSC201 when the sensor circuit SEN101 asserts the acknowledge signal ack221. When the request signal req221 is asserted, the sensor circuit SEN101 activates the body bias switch circuit through the use of a switch control signal to cause body bias output vbp111 and vbn111 to transition. The sensor circuit SEN101 detects that the voltage levels of the body bias output vbp111 and vbn111 reach a predetermined value, and asserts the acknowledge signal ack221 to return to the slave switch controller SSC201. When those two acknowledge signals ack201 and ack211 are both asserted, the master switch controller MSC201 will assert a module control signal mscs221 to convey to the gate circuit SG101. The gate circuit SG101 controls the operation or stoppage of the functional module FM101 in accordance with the module control signal mscs221.

Figure 10:
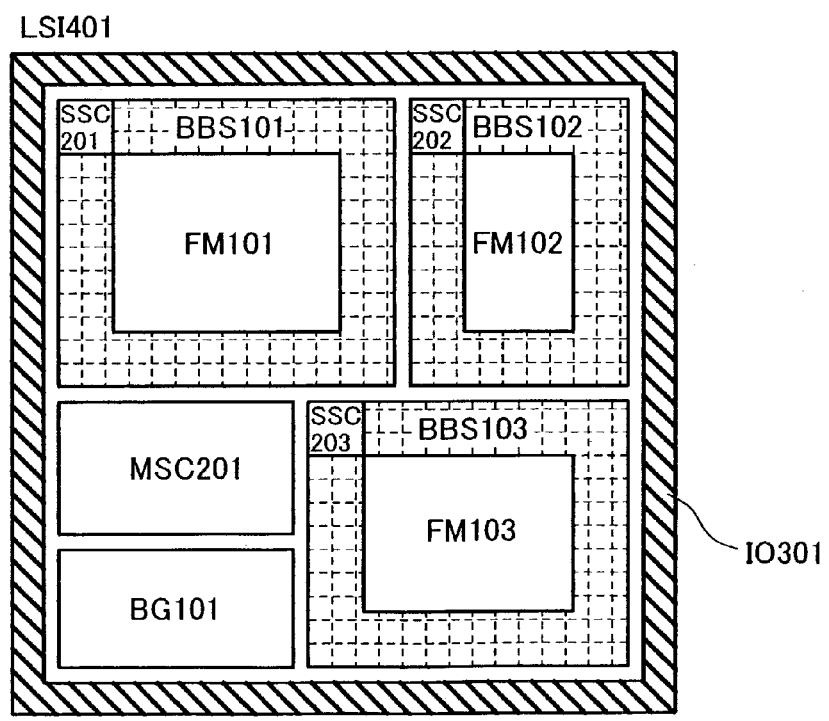
FIG. 10 is a view showing a layout of the second structural example according to the present invention.

FIG. 10 shows a layout of a semiconductor integrated circuit device according to the present invention. When comparing with the layout of FIG. 7 in particular, each slave switch controller SSC201 to 203 and each body bias switch circuit BBS101 to 103 are characterized in that they are laid out so as to surround the outer periphery of the functional module FM101 to 103 to which each of them corresponds. For example, the slave switch controller SSC201 and the body bias switch circuit BBS101 are laid out so as to surround the outer periphery of the functional module FM101.

Further, by arranging in accordance with such a layout, it becomes possible to divide each layout area into a layout area constructed of thin film transistors and a layout area constructed of thick film transistors. In the example of FIG. 10, the functional modules FM101 to 103 and the master switch controller MSC201 can be constructed of thin film transistors. In contrast to this, the slave switch controllers SSC201 to 203, the body bias switch circuits BBS101 to 103 and the bias generator BG101 can be constructed of thick film transistors. The transistors can be distinguished for each area as described above, whereby it is possible to prevent design errors in the layout design, and to improve the design efficiency and the reliability.

Figure 14:
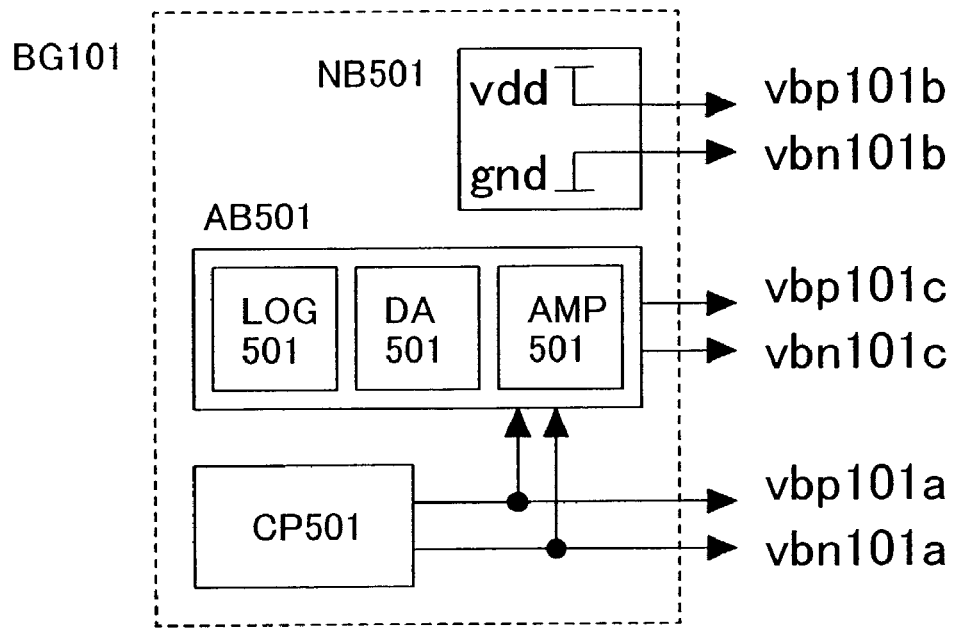
FIG. 14 is a view showing a structural example of a bias generator.

FIG. 14 shows a structural example of the bias generator. The bias generator BG101 is constructed of a normal body bias generator NB501, an adaptive body bias generator AB501 and a charge pump circuit CP501. The adaptive body bias generator AB501 is further constructed of a logic circuit LOG501, a D/A converter DA501 and an amplifier AMP501. The charge pump circuit generates voltage 2 vdd and voltage −vdd with respect to the supply voltage vdd and the ground voltage gnd to output as vbp 101$a$ and vbn101$a$ respectively. In order to raise the voltage generating efficiency, it is also possible to supply a higher voltage level than vdd to the charge pump circuit. The normal body bias generator NB501 outputs the supply voltage vdd as a vbp101$b$ signal, and the ground voltage gnd as a vbn101$b$ signal. The adaptive body bias generator AB501 outputs an optimum body bias within a range of 0.5 vdd to 2 vdd to vbp101$c$, and an optimum body bias within a range of 0.5 vdd to −vdd to vbn101$c$ through the use of output vbp101$a$ (=2 vdd) and vbn101$a$ (=vdd) from the charge pump circuit. When the adaptive body bias generator AB501 is used as a body generator for the high-speed high-leakage current mode, the output of 0.5 vdd is conveyed to vbp101$c$ and vbn101$c$.

Figure 22:
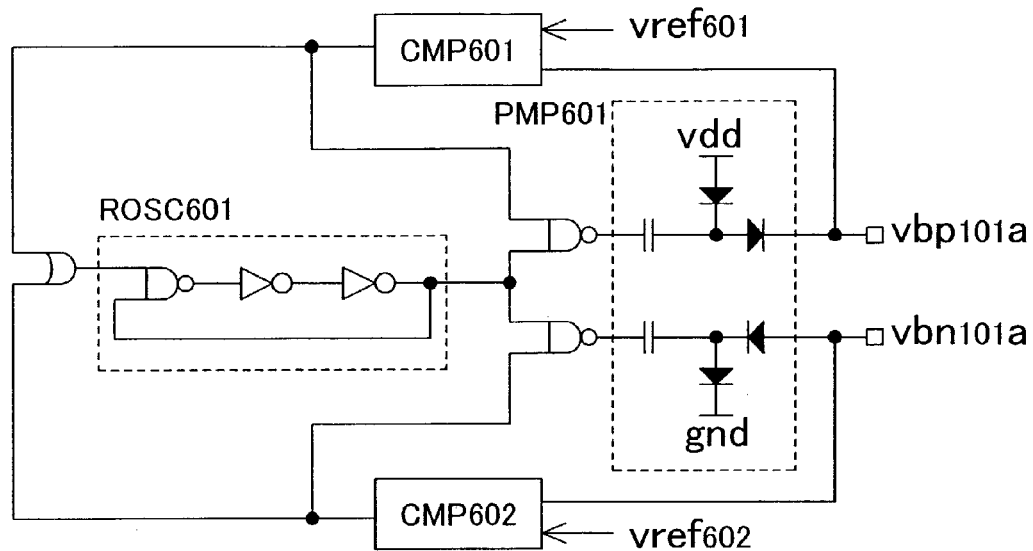
FIG. 22 is a view showing a structural example of a charge pump circuit.

FIG. 22 shows a structural example of the charge pump circuit CP501. A ring oscillator ROSC601 and the pump circuit PMP601 generate body bias output signals vbp101$a$ and vbn101$a$. When the level of the generated voltage vbp101$a$ exceeds reference voltage vref601 (=2 vdd), a comparator CMP601 does not convey output from the ring oscillator ROSC601 to the pump circuit PMP601 to suspend the supply of voltage. When the level of the generated voltage vbp101$a$ becomes lower than the reference voltage vref601, the ring oscillator ROSC601 and the pump circuit PMP601 are caused to operate again to generate voltage. By repeating this operation, the output vbp101$a$ becomes at a level substantially equal to the reference voltage vref601, and by eliminating the operating electric power for the charge pump circuit CP501 during stoppage, a low-power operation is realized. Similarly, when the level of the generated voltage vbn101a becomes lower than the reference voltage vref602 (=−vdd), the comparator CMP601 does not convey the output from the ring oscillator ROSC601 to the pump circuit PMP601 to suspend the supply of voltage. When the level of the generated voltage vbn101a becomes higher than the reference voltage vref602, the ring oscillator ROSC601 and the pump circuit PMP601 are caused to operate again for generating voltage. By repeating this operation, the output vbn101a becomes at a level substantially equal to the reference voltage vref602.

Figure 23:
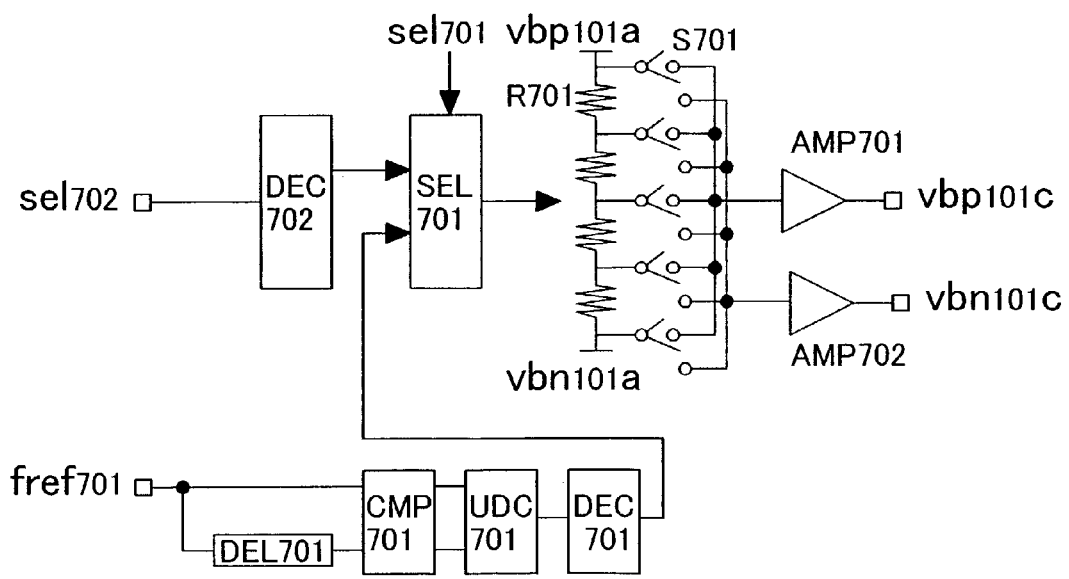
FIG. 23 is a view showing a structural example of a body bias generator for a high-speed operation.

FIG. 23 shows a structural example of the adaptive body bias generator AB501. The adaptive body bias generator AB501 is constructed of a delay circuit DEL701, a comparator CMP701, an up/down counter UDC701, decoders DEC701 and DEC702, a selector SEL701, amplifiers AMP701 and AMP702, a resistor R701, and a voltage switching circuit S701. When outputting 0.5 vdd to body biases vbp101c and vbn101c in, for example, a high-speed high-leakage current mode through the use of a fixed forward bias, the output from the decoder DEC702 is caused to take priority by a selection signal sel701 and the selector SEL701. In response to the input of a selection signal sel702, the voltage switching circuit S701 determines a desired body bias, and the current supplying capability is amplified by amplifiers AMP701 and AMP702 to output body biases vbp101c and vbn101c. At this time, the selection signal sel702 is made into an appropriate value, whereby a forward body bias 0.5 vdd can be obtained. A plurality of resistors R701 are connected in series between voltage vbp101a and vbn101a, whereby the voltage level between 2 vdd and −vdd is arbitrarily divided. Its output voltage is connected to amplifiers AMP701 and AMP702 by the voltage switching circuit S701, whereby desired voltage is outputted. When generating a body bias in a high-speed high-leakage current mode through the use of an optimum body bias, output from the decoder DEC701 is caused to take priority by the selection signal sel701 and the selector SEL701. An optimum body bias is determined by the delay circuit DEL701, the comparator CMP701, the up/down counter UDC701, and the decoder DEC701. Through the use of a reference clock signal fref701, delay of the delay circuit DEL701 is measured to digitize the amount of delay with the comparator CMP701 and the up/down counter UDC701. When the delay of the delay circuit DEL701 is larger than the initial design value, the body bias will be made shallow, while when smaller, the body bias is made deeper to thereby maintain the delay of the delay circuit DEL701 constant. Such a body bias is outputted as vbp101c and vbn101c, whereby the body bias is controlled so as to always maintain the operating speed of the CMOS circuit constant. Therefore, the body bias is controlled, whereby variations in the manufacturing process of the MOS transistor and performance variations of the CMOS circuit associated with changes in temperature and variations in voltage will be restrained to realize high-speed and low power consumption. In the adaptive body bias generator AB501, such different usage can be taken, both can be also switched by the selection signal sel701, and only one side can be also applied to an actual chip.

Figure 24:
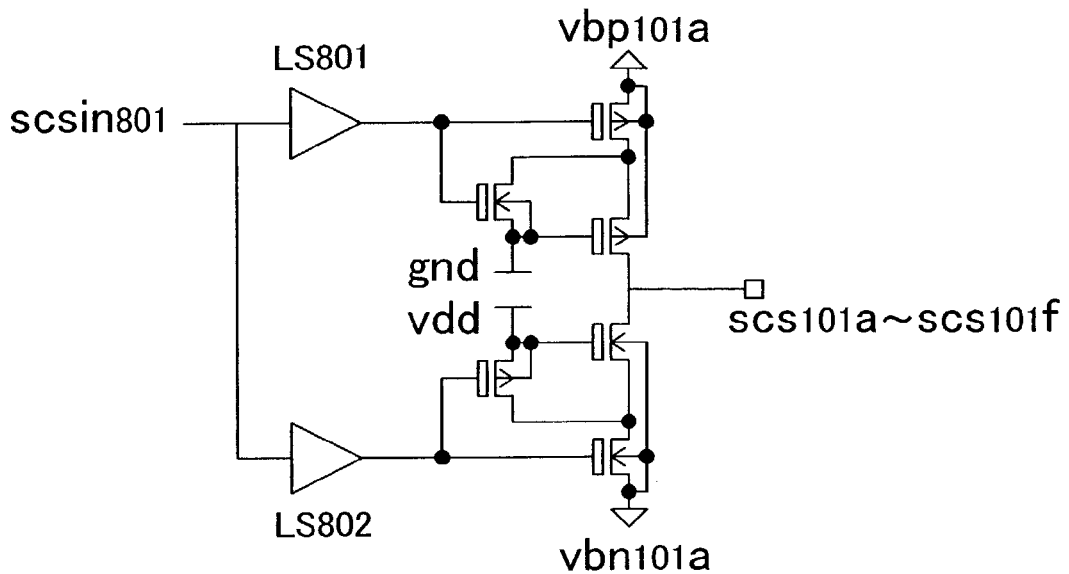
FIG. 24 is a view showing a structural example of a slave switch controller.
Figure 25:
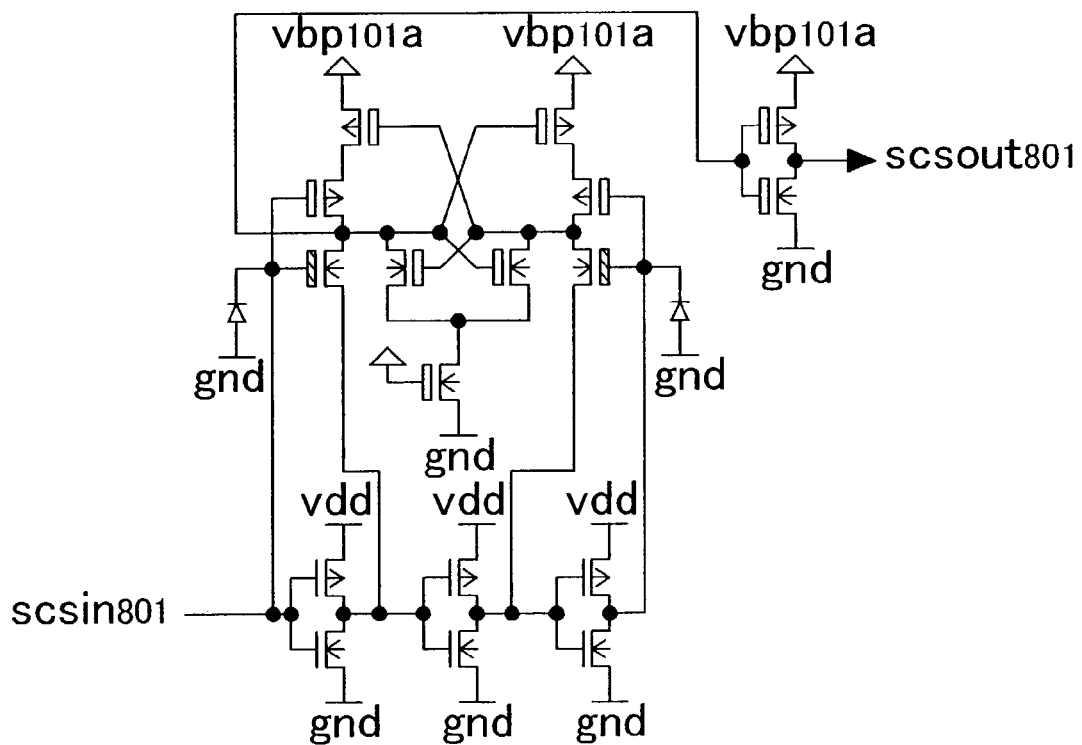
FIG. 25 is a view showing a structural example of a level shifter.
Figure 26:
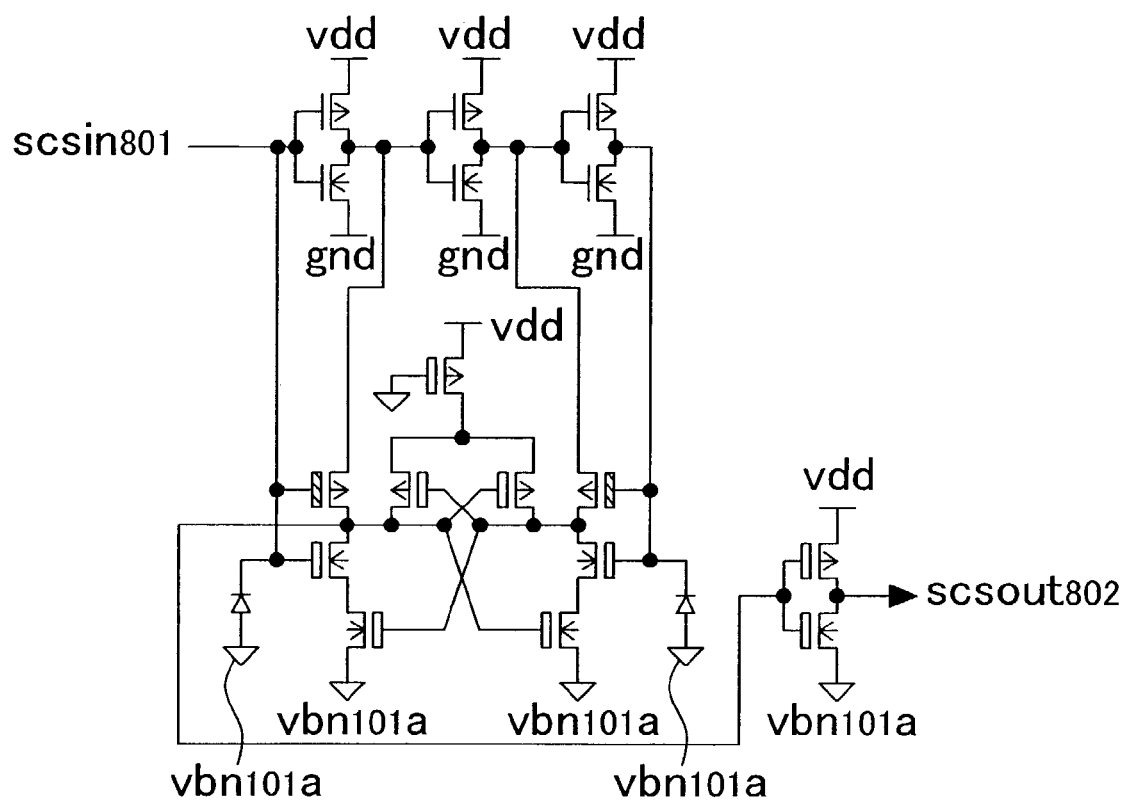
FIG. 26 is a view showing a structural example of the level shifter.

FIG. 24 is a view showing a structural example of the slave switch controller. When a thick film transistor capable of withstanding voltage corresponding to 3 vdd is used, the slave switch controller can be constructed of a logic circuit represented by a normal inverter or the like. When the thick film transistor can withstand only about 2 vdd, such structure as shown in FIG. 24 is required. In this case, the slave switch controller can be implemented by constituting the level shifters LS801 and LS802 and the thick film MOS transistor as shown in the drawing. The level shifter LS801 converts an input signal scsin801 from a vdd/gnd level to a 2 vdd/gnd level. Similarly, the level shifter LS802 converts the signal level of output into a vdd/−vdd level with respect to an input signal scsin801 being at a vdd/gnd level. With this structure, even when the amplitude of output scs101a to 101f is 3 vdd, the total of 2 vdd to −vdd, the structure is arranged such that voltage of 2 vdd or more is not applied to each MOS transistor. FIGS. 25 and 26 show structural examples of the level shifters LS801 and LS802 respectively. In a circuit part in which the input signal scsin801 is received at a vdd/gnd level, the thin film transistor is used with a range of supply voltage of vdd/gnd. In a part in which this signal level is converted into 2 vdd/gnd or vdd/−vdd level, the thick film transistor is used. Of the thick film transistors, transistors indicated by oblique lines in particular are constructed of transistors having low threshold, which enhances reliability in voltage conversion.

Figure 15:
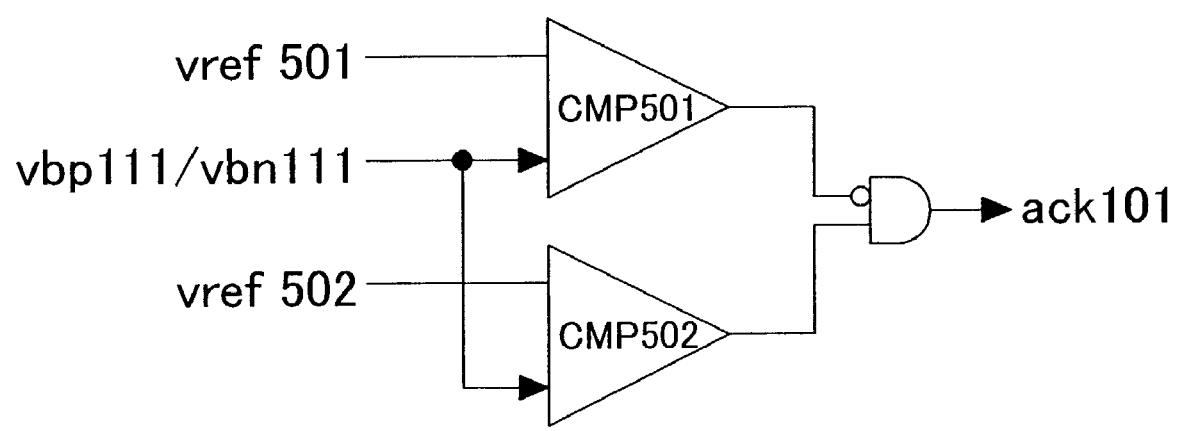
FIG. 15 is a view showing a first structural example of a sensor circuit.
Figure 16:
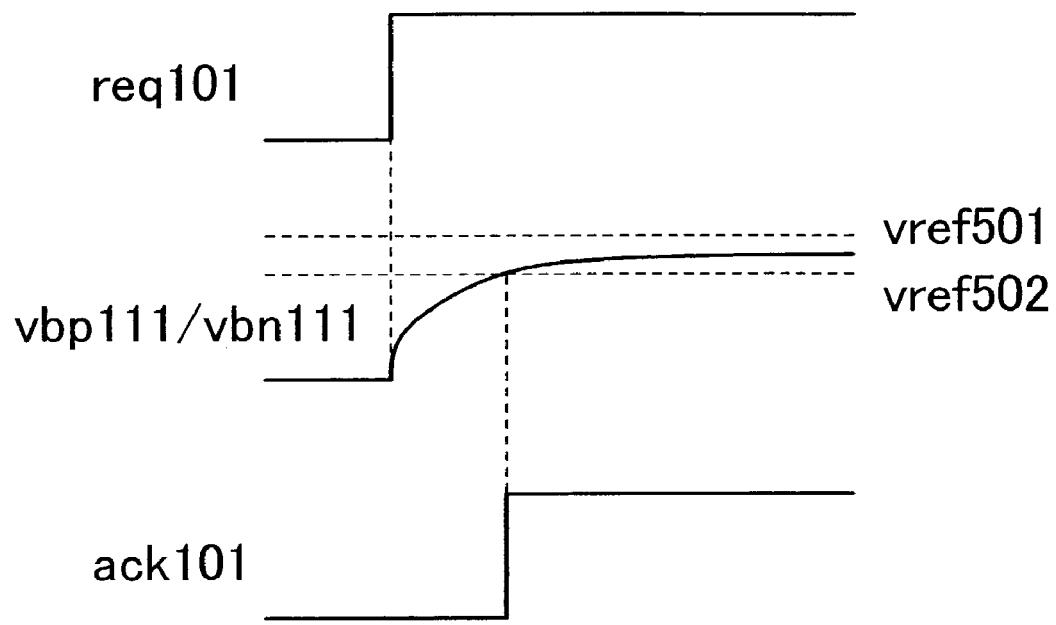
FIG. 16 is an operating waveform view showing the first structural example of the sensor circuit.

FIG. 15 is a view showing a structural example of the sensor circuit. The sensor circuit is constructed of the comparators CMP501 and the CMP502 and a digital logic circuit. The comparators CMP501 and CMP502 compare with the reference voltage vref501 and vref502 respectively to judge whether the signal voltage level of vbp111 and vbn111, that are input signals, is high or low. As shown in the operating waveform of FIG. 16, in the case where the body bias output vbp111 or vbn111 causes the voltage level to transition as shown in the drawing after the request signal req101 is asserted, the acknowledge signal ack101 will be asserted when the level of the voltage that transitions enters between the reference voltage vref501 and vref502. In this manner, the sensor circuit judges that the body bias output has reached the desired value.

Figure 17:
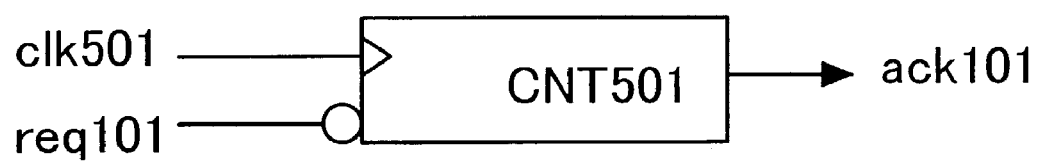
FIG. 17 is a view showing a second structural example of the sensor circuit.
Figure 18:
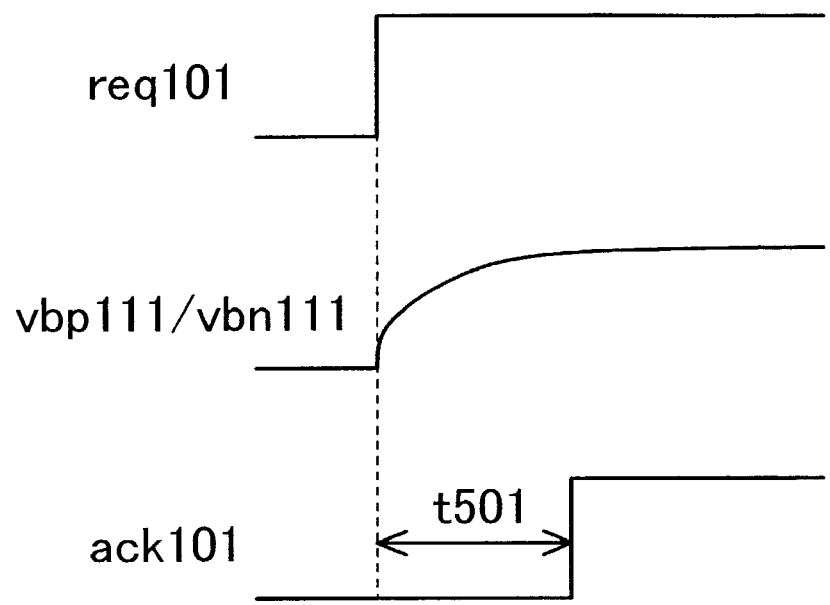
FIG. 18 is a view showing operating waveforms of the second structural example of the sensor circuit.

FIG. 17 is a view showing another structural example of the sensor circuit. The sensor circuit is constructed of the counter circuit CNT501. When the request signal req101 is asserted as shown in the operating waveform of FIG. 18, the counter circuit CNT501 counts in response to a clock signal clk501, and asserts the acknowledge signal ack101 when counting is made for a predetermined time period (t501). In the case of this sensor circuit, the voltage level of the body bias output vbp111 and vbn111 is not directly detected. If the design is made with a sufficiently long time period for the transition time for the body bias as t501, it is to be judged in an indirect way that the body bias output has reached the desired value.

The body bias control system explained so far has been described assuming the design system within one chip, but it may be possible to adopt a system in which a plurality of chips is used. It may be, for example, a system which is constructed with the switch controller and the bias generator used as one chip respectively, and with each functional module and the body bias switch circuit corresponding thereto as one chip respectively.

What is claimed is:

1. A semiconductor integrated circuit device, comprising:
   a bias generator to generate a first body bias voltage, a second body bias voltage and a third body bias voltage;
   a circuit module including at least a MOS transistor;
   a body bias switch circuit including a first MOS transistor to control supply of the first body bias voltage, a second MOS transistor to control supply of the second body bias voltage and a third MOS transistor to control supply of the third body bias voltage, respectively; and
   a switch controller to control the body bias switch circuit, wherein when the circuit module is in a first state, the switch controller to turn on the first MOS transistor of the body bias switch circuit to supply the first body bias voltage to a well of the MOS transistor of the circuit module; when the circuit module is in a second state, the switch controller to turn on the second MOS transistor of the body bias switch circuit to supply the second body bias to the well of the MOS transistor of the circuit module; and when the circuit module is in a third state, the switch controller to turn on the third MOS transistor of the body bias switch circuit to supply the third body bias voltage to the well of the MOS transistor of the circuit module, the switch controller to transmit a first request signal to the bias generator, and to receive a first acknowledge signal indicating that a bias signal generated by the bias generator has been stabilized, the switch controller to transmit a second request signal to the body bias switch circuit, and to receive a second acknowledge signal indicating that the control of the body bias switch circuit has been completed, and the switch controller to receive the first acknowledge signal and the second acknowledge signal and to transmit, to the circuit module, a control signal to start the operation of the circuit module.

* * * * *